United States Patent
Shen et al.

(10) Patent No.: US 7,665,003 B2
(45) Date of Patent: Feb. 16, 2010

(54) METHOD AND DEVICE FOR TESTING MEMORY

(75) Inventors: Jian Shen, Austin, TX (US); Paul Bassett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 425 days.

(21) Appl. No.: 11/611,715

(22) Filed: Dec. 15, 2006

(65) Prior Publication Data

US 2008/0144412 A1      Jun. 19, 2008

(51) Int. Cl.
    *G01R 31/28* (2006.01)
(52) U.S. Cl. .................. 714/733; 714/718; 711/168
(58) Field of Classification Search ............... 711/168, 711/167, 169; 714/718, 733
    See application file for complete search history.

(56) References Cited

U.S. PATENT DOCUMENTS

| | | | | |
|---|---|---|---|---|
| 4,814,976 A | * | 3/1989 | Hansen et al. | 711/201 |
| 5,299,169 A | * | 3/1994 | Miyamoto | 365/230.05 |
| 5,557,768 A | * | 9/1996 | Braceras et al. | 711/131 |
| 5,719,810 A | * | 2/1998 | Lee et al. | 365/189.02 |
| 5,802,579 A | * | 9/1998 | Crary | 711/149 |
| 6,182,257 B1 | * | 1/2001 | Gillingham | 714/733 |
| 6,275,428 B1 | | 8/2001 | Fukuda | |
| 6,556,483 B2 | * | 4/2003 | Ryan et al. | 365/189.04 |
| 7,310,748 B2 | * | 12/2007 | Jeddeloh | 714/42 |
| 2005/0010841 A1 | | 1/2005 | Lee | |
| 2005/0024977 A1 | | 2/2005 | Ong | |
| 2005/0185495 A1 | | 8/2005 | Lee | |

* cited by examiner

*Primary Examiner*—Kevin L Ellis
*Assistant Examiner*—Steve Nguyen
(74) *Attorney, Agent, or Firm*—Peter M. Kamarchik; Nicholas J. Pauley; Sam Talpalatsky

(57) ABSTRACT

A method of testing a memory is provided that includes initiating a test on a computer readable memory. The computer readable memory provides output data associated with the test. Further, the method includes selecting to receive the output data from a first register or a second register. In a particular embodiment, the method may include selecting to receive the output data from the first register or the second register by use of a control line. In another particular embodiment, the method may include selecting to receive the RAM input data from the first register or the second register by use of a control line. The control line is configured dynamically by hardware or software on cycle by cycle basis. In a particular embodiment, the test is a built-in-self-test (BIST).

29 Claims, 7 Drawing Sheets

METHOD AND DEVICE FOR TESTING MEMORY

BACKGROUND

I. Field of the Disclosure

The present disclosure relates generally to the design and testing of a memory device and more specifically relates to a method and device for testing memory.

II. Description of the Related Art

A memory device, such as a random access memory (RAM), can have multiple arrays including multiple storage elements. An array can have word lines and bit lines that allow for storing binary data in addressable storage elements. Errors such as shorts between bit lines may occur during manufacture or during use of a RAM. A built-in-self-test (BIST) can be used for detecting such errors.

However, in some processor architectures operating in a BIST mode, a read operation and a write operation could result in data collisions, such as when a BIST read operation and a BIST write operation attempt to access the same register.

Accordingly, it would be advantageous to provide an improved method and device for testing a memory.

SUMMARY

In a particular embodiment, a device is provided that includes a computer readable memory having a first input and a first output. The device also includes a first register for storing data, the first register having a second input and a second output. The second output of the first register is coupled to the first input of the computer readable memory. In addition, the device includes a second register for storing data, the second register having a third input and a third output. The third input is coupled to the first output of the computer readable memory. Further, the device includes logic responsive to the second output of the first register and the third output of the second register for dynamically switching between selection of the second output of the first register and the third output of the second register.

In another particular embodiment, a method is provided for performing a test of a computer readable memory. The method includes storing test data retrieved from the computer readable memory to a first register and a second register. The method also includes dynamically selecting output data from one of the first register or the second register.

In another particular embodiment, a method is provided that includes initiating a test on a computer readable memory. The computer readable memory provides output data associated with the test. Further, the method includes selecting to receive the output data from one of a first register and a second register.

In another particular embodiment, a device is provided that includes a computer readable memory. The device also includes a controller operable to initiate a test of the computer readable memory. In addition, the device includes logic coupled to the controller. The logic is operable to dynamically select a logic output to correspond to an output of a first register or an output of a second register. The first register and the second register store data resulting from the test from the computer readable memory.

In another particular embodiment, a wireless communication device is provided that includes an antenna. The wireless communication device also includes a transceiver operably coupled to the antenna. The wireless communication device also includes a processor coupled to the transceiver and a memory unit coupled to the processor. The wireless communication device includes a controller coupled to the processor and operable to initiate a test on the memory unit. The wireless communication device includes logic coupled to the controller and to the memory unit. The logic is operable to allow dynamic selection of one of an output from a first register or an output from a second register. The first register and the second register store output data of the test from the memory unit.

In another particular embodiment, a device is provided that includes a computer readable memory having multiple access ports and multiple outputs. The device includes a controller operable to initiate a test of the computer readable memory. Further, the device includes a multiplexer coupled to the controller. The multiplexer has multiple inputs and each of the computer readable memory outputs is coupled to one of the multiple inputs. Further, the multiplexer has a control line for dynamic selection of an output of the multiplexer to correspond to one of the multiple inputs.

In another particular embodiment, a device is provided that includes a computer readable memory. The device also includes means for testing the computer readable memory. The device also includes means for dynamic selection during the testing of one of an output of a first register and an output of a second register.

One particular advantage of the described device and method is that data collisions of a shared register used for memory testing can be avoided. Another particular advantage is that there is no loss of at-speed test coverage of the functional data paths.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE DRAWINGS

Figure 1:
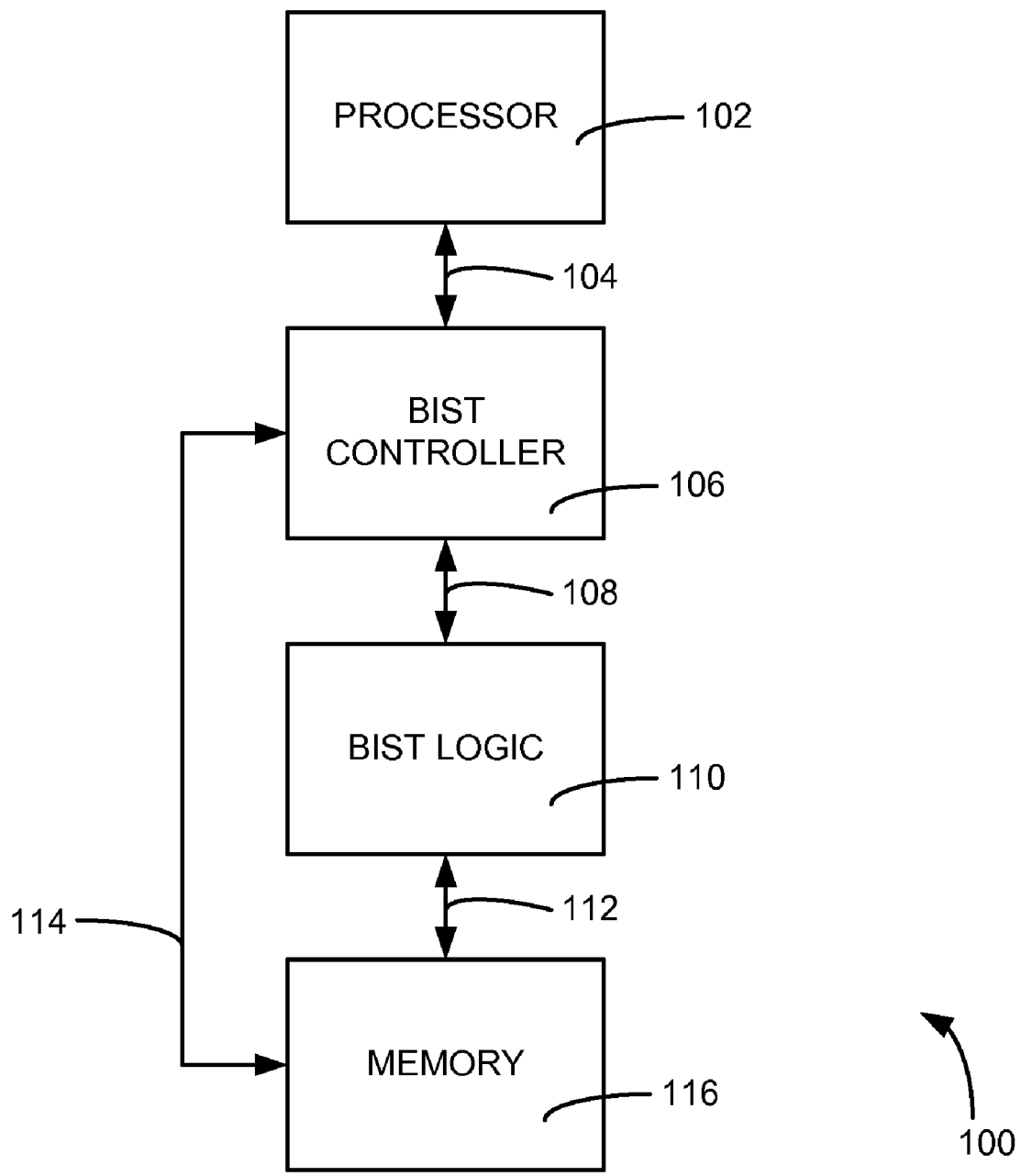
FIG. 1 is a block diagram of a particular illustrative embodiment of a memory and of a device for testing a memory.

FIG. 1 is a block diagram of a particular illustrative embodiment of a device 100 for testing a memory 116. The device 100 includes a processor 102 coupled to a controller 106. The processor 102 can send instructions, such as an instruction to conduct a built-in-self-test (BIST), to the controller 106 over line 104. The controller 106 is programmed to execute one or more instructions to conduct a BIST. In a particular embodiment, a BIST is a function of a circuit that can verify all or some of its functionality. The controller 106 is coupled to logic 110 by line 108. The logic 110 is operable to execute a BIST on memory 116 when initiated over line 108. In a particular embodiment, the logic 110 can send control signals to and receive data from the memory 116 over line 112. The memory 116 can be internal to the processor 102 or the controller 106. Alternatively, the memory 116 can be external to the processor 102 or the controller 106. In a particular embodiment, line 112 comprises multiple communication and control lines to the memory 116. In another embodiment, the controller 106 can send control signals to and receive data from the memory 116 over line 114. In a particular embodiment, the processor 102, the controller 106, and the logic 110 are incorporated into a single integrated circuit. Lines 104, 108, 112, and 116 can each comprise multiple lines or other connections or interfaces that allow the function of the components to be accomplished.

Figure 2:
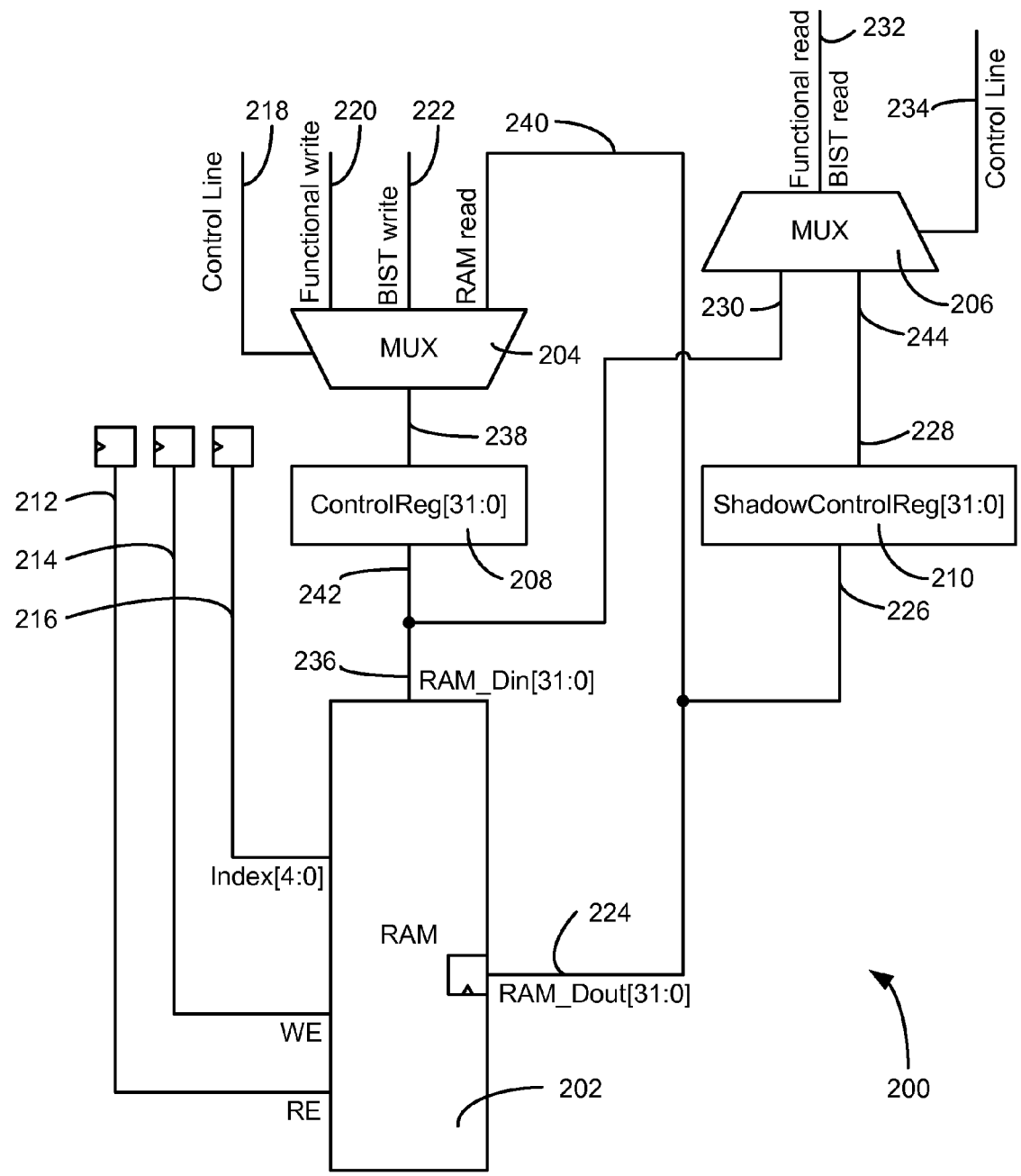
FIG. 2 is a block diagram of a particular illustrative embodiment of a memory and of a device for testing a memory.

FIG. 2 is a block diagram of a particular illustrative embodiment of a device 200 for testing a memory 202. In a particular embodiment, memory 202 is random access memory (RAM). The memory 202 includes a read enable input 212, a write enable input 214, and an address input 216. In a particular embodiment, the memory 202 includes a single port data input 236 and a single data output 224. In a particular embodiment, the data output 224 of the memory 202 is a 32-bit output. In addition, the device 200 includes a first multiplexer 204, a second multiplexer 206, a first register 208, and a second register 210.

In a particular embodiment, the first multiplexer 204 includes a control line input 218 that may be connected to a controller, such as the controller 106 of FIG. 1. The first multiplexer 204 can also include a functional write data input 220 that is used for receiving data during a non-BIST write operation. The first multiplexer 204 can also include a BIST write data input 222 and an input 240 coupled to the data output 224 of the memory 202. The control line input 218 can be used to select between the functional write data input 220, the BIST write data input 222, and the memory input 240. The first multiplexer 204 provides the selected input at the first multiplexer output 238.

In a particular embodiment, the first register 208 is a 32-bit control register. An output 242 of the first register 208 is provided to the data input 236. In addition, the second register 210 includes an input 226 coupled to the data output 224. The second register 210 provides an output 228. In a particular embodiment, the second register 210 is a 32-bit control register.

In a particular embodiment, the second multiplexer 206 includes a control line 234 that may be connected to a controller, such as the controller 106 of FIG. 1. The second multiplexer 206 also includes an output 232, an input 230 coupled to the output 242 of the first register 208, and an input 244 coupled to the output 228 of the second register 210. The second register 210 may be referred to as a shadow control register. The output 232 can be used for a BIST operation output or for a non-BIST operation output.

In a particular embodiment, during a non-BIST read operation, i.e. a functional read operation, the memory 202 receives a read enable signal via read enable input 212. An address corresponding to the read enable signal is provided to the memory 202 via the address input 216. The memory 202 provides the data corresponding to the address at the data output 224. The data output is then passed through the first multiplexer 204 to the first register 208 where the corresponding data is then provided at the first register output 242. The first register output 242 is then provided at the second multiplexer output 232.

During a non-BIST write operation, i.e. a functional write operation, the memory 202 receives a write enable signal via write enable input 214. An address corresponding to the write enable signal is provided to the memory 202 via the address input 216. The data to be written is received at the first multiplexer 220 and stored in the first register 208. The data is then passed to the memory 202 to be written at the corresponding address.

In general, by utilizing the second register 210, the device 200 can avoid data collisions in the first register 208 that can occur when a write operation and a previous read operation attempt to access the first register 208. Such collisions can occur during BIST operations where alternating reads and writes are tested. In a particular embodiment, a data collision can occur when a BIST read operation is executed and a BIST write operation is subsequently executed. When the BIST read operation and the BIST write operation attempt to store data in the first register 208 at the same time, a data collision can occur. When there is a possibility of a data collision occurring in the first register 208, a processor or controller, such as controller 106, can select to receive the output of the second register 210 instead of the first register 208.

In addition, the second multiplexer 206 allows for dynamic selection of either the input 230 or the input 244 for testing during a BIST. Thus, both the first register output 242 data path and the second register output 228 data path can be tested using a BIST. Testing both data paths allows for testing of the functional data path through the first register. Additionally, there is no loss of at-speed test coverage of the functional data paths.

In a particular embodiment, during a memory test, a BIST operation may be executed that includes a test write operation. During such a test write operation, test data is provided on the BIST write data input 222 of the first multiplexer 204 while the control line 218 of the first multiplexer 204 selects the BIST write data input 222 to be provided as the output 238 of the first multiplexer 204. The output of the first multiplexer 204 is stored in the first register 208 and then provided to the data input 236 of the memory 202. The write enable input 214 provides a signal from a controller or processor, such as the controller 106, to indicate a write operation to the memory 202. The address input 216 provides a signal from a controller or processor, such as the controller 106, to indicate the specific address of the memory 202 to store the data from the data input 236.

In a particular embodiment, during a memory test, a BIST operation may be executed that includes a test read operation. During such a test read operation, the memory 202 receives a signal at the read enable input 212 that indicates a read operation and the address input 216 provides a signal from a controller or processor, such as the controller 106, to indicate the specific address of the memory 202 to read the data from. The read data is then provided at the data output 224 of the memory device 202 and stored in the second register 210. In addition, the data output 224 of the memory device 202 is provided to the first multiplexer 204, while the control line 218 of the first multiplexer 204 selects the data input 240 that is coupled to the data output 224 of the memory device 202 to be provided as the output 238 of the first multiplexer 204. The output of the first multiplexer 204 is stored in the first register 208 and then provided to the input 230 of the second multiplexer 206. The control line 234 is coupled to a processor or controller, such as the controller 106, to select the output 230 from the first register 208 or the output 244 from the second register 210 to be provided at the output 232 of the second multiplexer 206.

In a particular embodiment, a data collision can occur when a BIST read operation is executed as described above and a BIST write operation is subsequently executed. For example, a BIST read operation may be executed that takes more than one clock cycle to store the output data 224 of the memory 202 in the first register 208. By the time the BIST read operation is attempting to write the output data 224 of the memory 202 in the first register 208, a BIST write operation may have been executed that also is attempting to store data in the first register 208. When the BIST read operation and the BIST write operation attempt to store data in the first register 208 at the same time, a data collision can occur. When there is a possibility of a data collision occurring in the first register 208, a processor or controller, such as controller 106, can select to receive the output 228 of the second register 210 as the output 232 of the second multiplexer 210.

In a particular embodiment, a processor or controller, such as controller 106, can select to receive the output 228 of the second register 210 as the output 232 of the second multiplexer 210, via control line 234, when executing a write operation that utilizes the first register 208. In another particular embodiment, a processor or controller, such as the controller 106, can select to receive the output 228 of the second register 210 as the output 232 of the second multiplexer 210 when executing a read operation.

Figure 3:
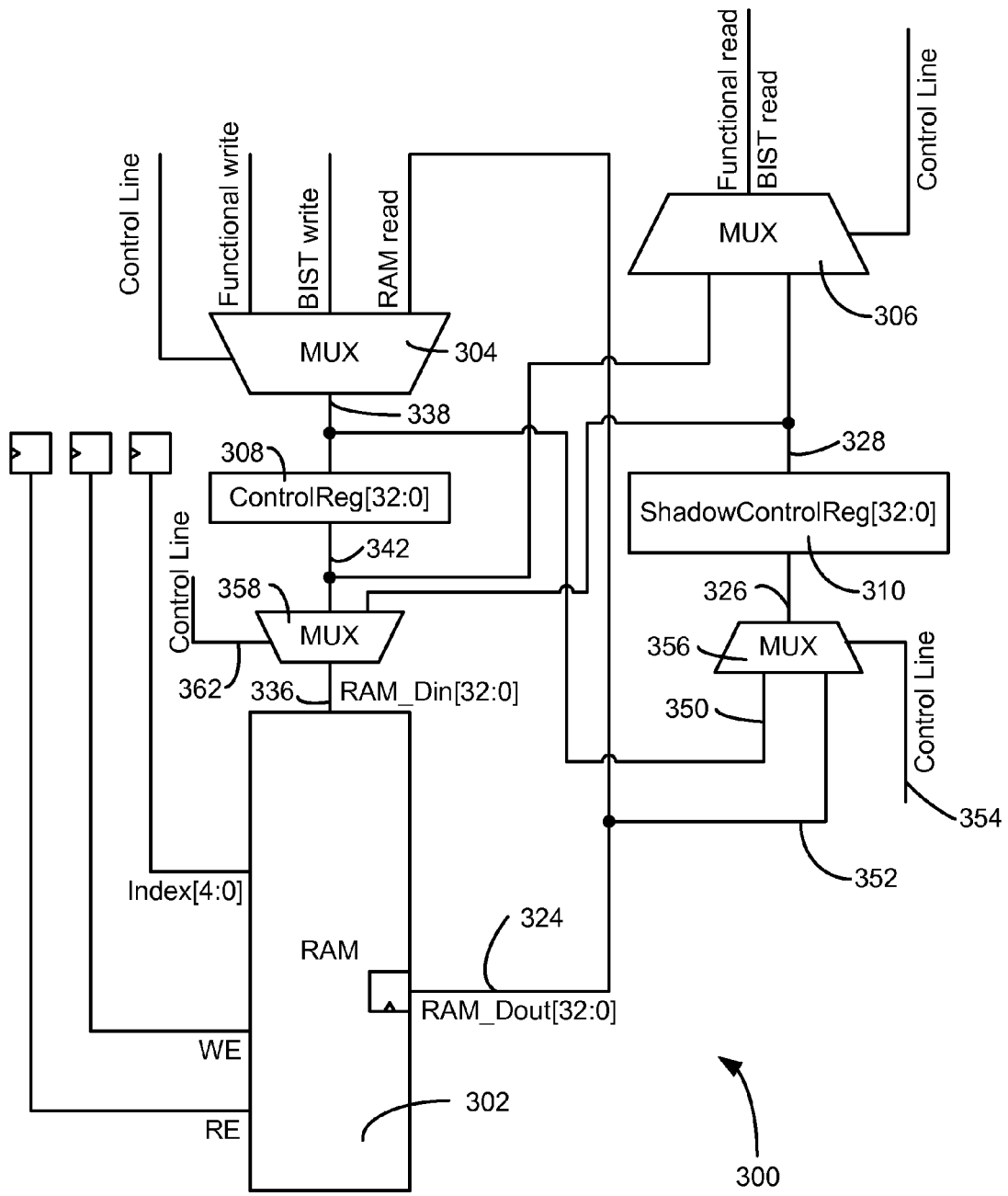
FIG. 3 is a block diagram of a particular illustrative embodiment of a memory and of a device for testing a memory.

FIG. 3 is a block diagram of a particular illustrative embodiment of a device 300 for reading data from and writing data to a memory 302. The device 300 has a first multiplexer 304, a second multiplexer 306, a third multiplexer 356, and a fourth multiplexer 358. The memory 302 has an output 324 that is coupled to a first input 352 of the third multiplexer 356. An output 338 of the first multiplexer 304 is coupled to a second input 350 of the third multiplexer 356.

The third multiplexer 356 allows for dynamic selection of write data to be stored in a second register 310. An output of the third multiplexer 356 is coupled to the input of the second register 310. The dynamic selection is via a control line 354. An output 326 of the third multiplexer 356 is coupled to an input of the second register 310. When the control line 354 designates input 350, the output 338 of the first multiplexer 304 is stored in the second register 310.

The fourth multiplexer 358 allows for dynamic selection of an output 342 from the first register 308 or the output 328 from the second register 310 to be stored in the memory 302. An output of the fourth multiplexer 358 is coupled to an input 336 of the memory 302. The dynamic selection is via a control line 362. When the control line 362 designates the output 328 of the second register 310, the output 328 is stored in the memory 302.

Figure 4:
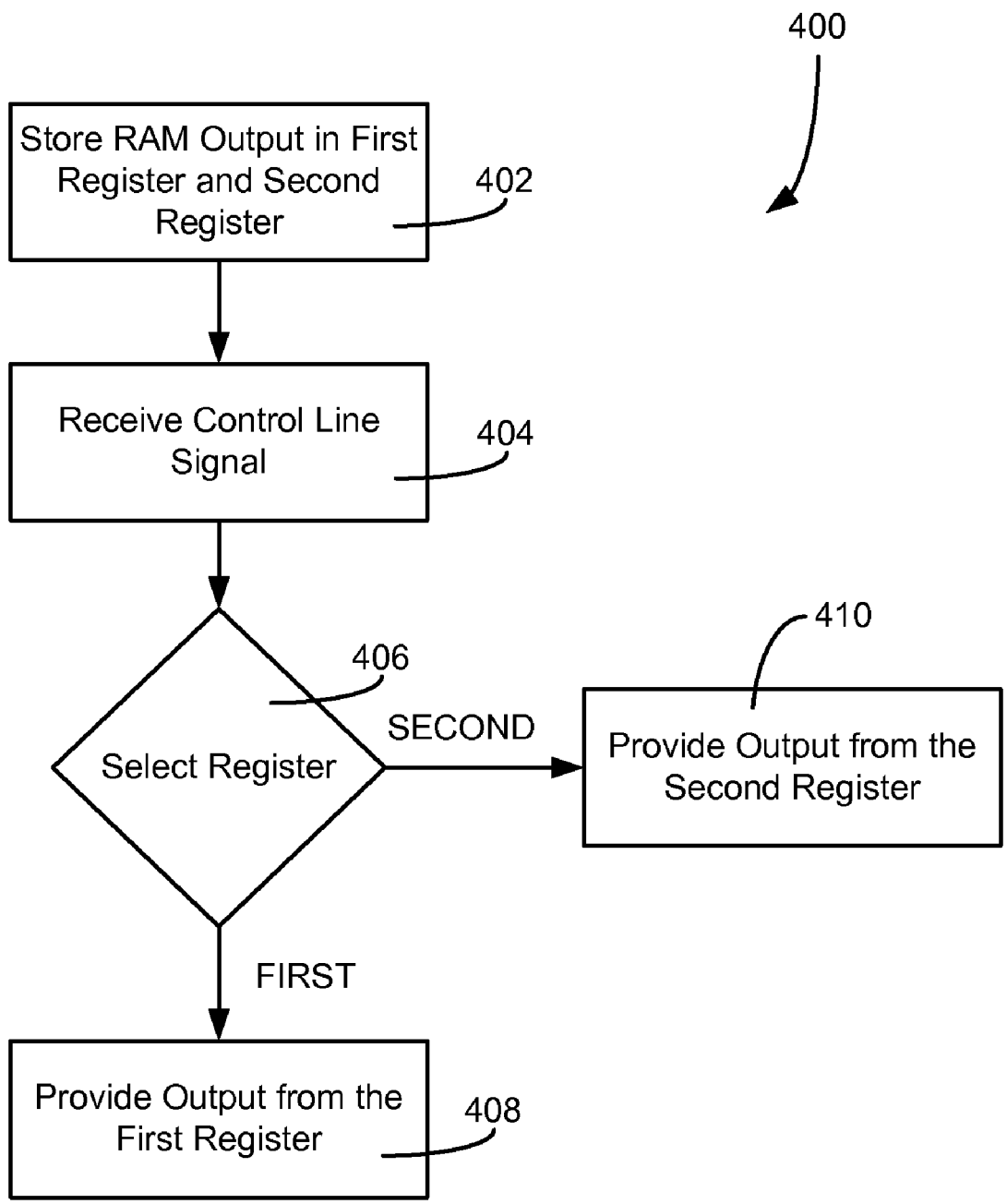
FIG. 4 is a flow diagram of a particular illustrative embodiment of a method of testing a memory.

FIG. 4 is a flow diagram of a particular illustrative embodiment of a method 400 of testing a memory, such as the memory 202. During testing, output data is stored in a first register and a second register, at 402. In a particular embodiment, the output data is test data retrieved from a memory under test. A control signal is received, at 404. The control signal indicates a selection of output data from either the first register or the second register, at 406. The method provides the output data from the first register when the first register is selected, at 408 and provides the output data from the second register when the second register is selected, at 410.

In a particular embodiment, the control signal is received, at 404, by a control line that selects a specific input of a multiplexer. In another particular embodiment, the first register is selected when executing a BIST operation that does not create a data collision with a previous operation and the second register is selected when executing a BIST operation that can create a data collision in the first register with a previous operation. In a further embodiment, the second register is selected when executing a BIST write operation following a BIST read operation.

In a particular embodiment, a data collision can occur when a BIST read operation is executed and a BIST write operation is subsequently executed. When the BIST read operation and the BIST write operation attempt to store data in the first register, such as the first register 208, at the same time, a data collision can occur. When there is a possibility of a data collision occurring in the first register, such as the first register 208, a processor or controller, such as controller 106, can select to receive the output of the second register, such as the second register 210, instead of the first register 208.

Referring to FIG. 4, in a particular embodiment, a processor or controller, such as controller 106, can select to receive the output of the second register when executing a write operation that utilizes the first register. In another particular embodiment, a processor or controller, such as controller 106, can select to receive the output of the second register when executing a read operation. In another particular embodiment, the first register is selected when executing a BIST operation that does not create a data collision with a previous operation and the second register is selected when executing a BIST operation that may create a data collision in the first register with a previous operation. In a further embodiment, the second register is selected when executing a BIST write operation following a BIST read operation. In a further illustrative embodiment, the second register may be selected only when executing a BIST write operation immediately following a BIST read operation.

In another particular embodiment, the method 400 can selectively store output data in only a first register, in only a second register, or in both the first register and the second register as shown at 402.

Figure 5:
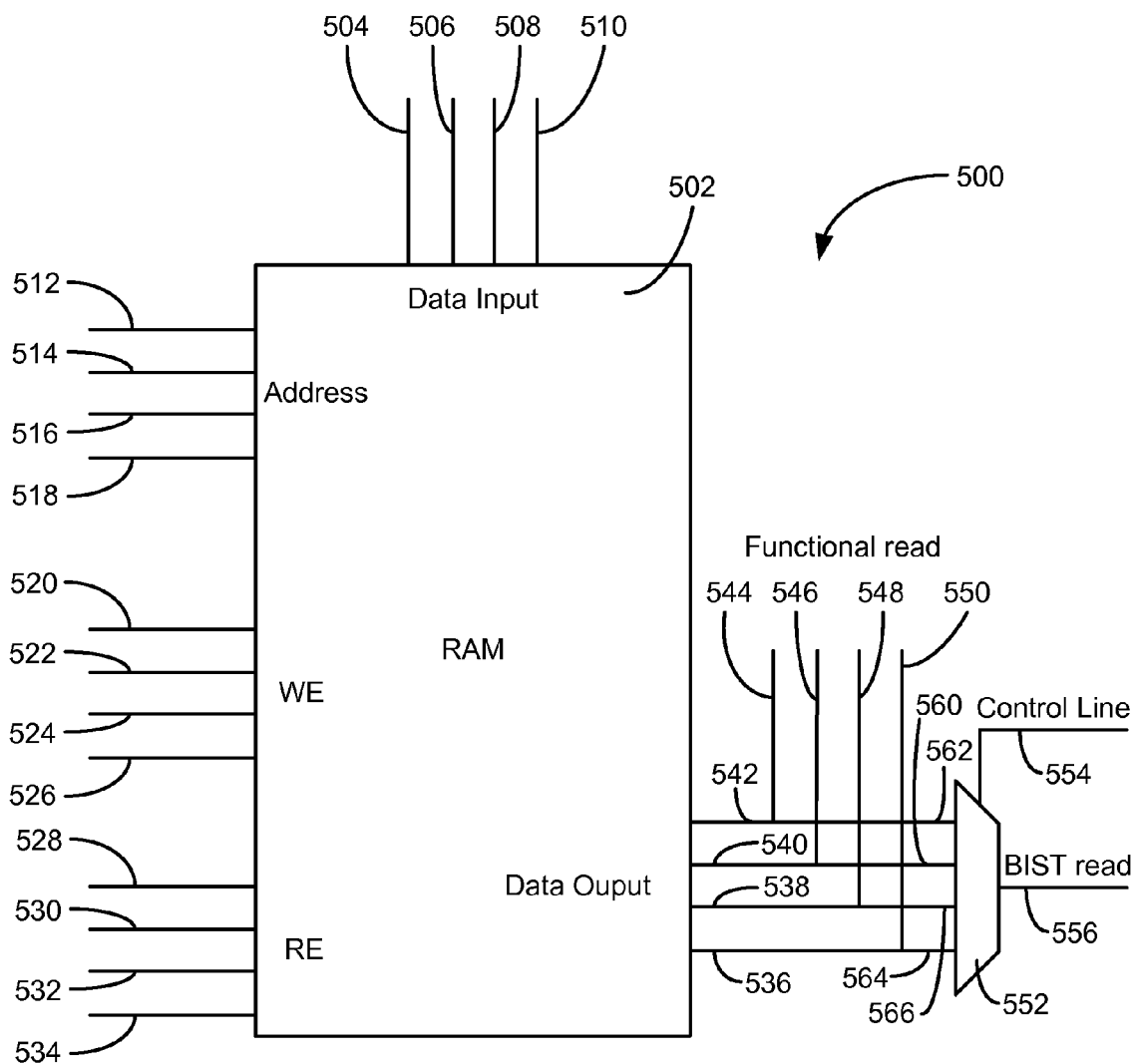
FIG. 5 is a block diagram of a particular illustrative embodiment of a memory and of a device for testing a memory.

FIG. 5 is a block diagram of a particular illustrative embodiment of a device 500 for testing a multi-port memory 502. In a particular embodiment, memory 502 is a random access memory (RAM). The memory 502 includes representative data inputs 504, 506, 508, and 510 and representative address inputs 512, 514, 516, and 518. The memory 502 includes representative write enable inputs 520, 522, 524, and 526 and representative read enable inputs 528, 530, 532, and 534. The memory 502 also includes representative data outputs 536, 538, 540, and 542. Functional read outputs 544, 546, 548, and 550 are each coupled to a respective one of the data outputs 536, 538, 540, and 542. The functional read outputs 544, 546, 548, and 550 can be used for reading data for non-BIST operations.

In a particular embodiment, multiplexer 552 includes inputs 560, 562, 564, and 566 that are each coupled to one of the data outputs 536, 538, 540, and 542 of the memory 502. Control line 554 allows for selection of one of the inputs 560, 562, 564, and 566 to be provided at the multiplexer output 556. In a particular embodiment, control line 554 is coupled to a logic device, such as the controller 106 of FIG. 1.

The multiplexer 552 allows for dynamic selection of one of the inputs 560, 562, 564, and 566 for testing during a BIST. Thus, any of the memory 502 output data paths can be tested using a BIST.

In a particular embodiment, during a memory test, a BIST operation may be executed that includes a test read operation. During such a test read operation, the memory 502 receives a signal at one of the read enable inputs, such as read enable input 530, that indicates a read operation and the corresponding address input 514 provides a signal from a controller or processor to indicate the specific address of the memory 502 to read the data from. The read data is then provided at the data output 540 of the memory device 502. The data output 540 of the memory device 502 is provided to the multiplexer 552. The control line 554 of the multiplexer 552 selects the data input 560 that is coupled to the data output 540 of the memory device 502 to be provided as the output 556 of the multiplexer 552. Any of the other read or write inputs may be selected for testing by applying the appropriate control signals. Thus, enhanced BIST coverage for a multiport memory may be provided.

Figure 6:
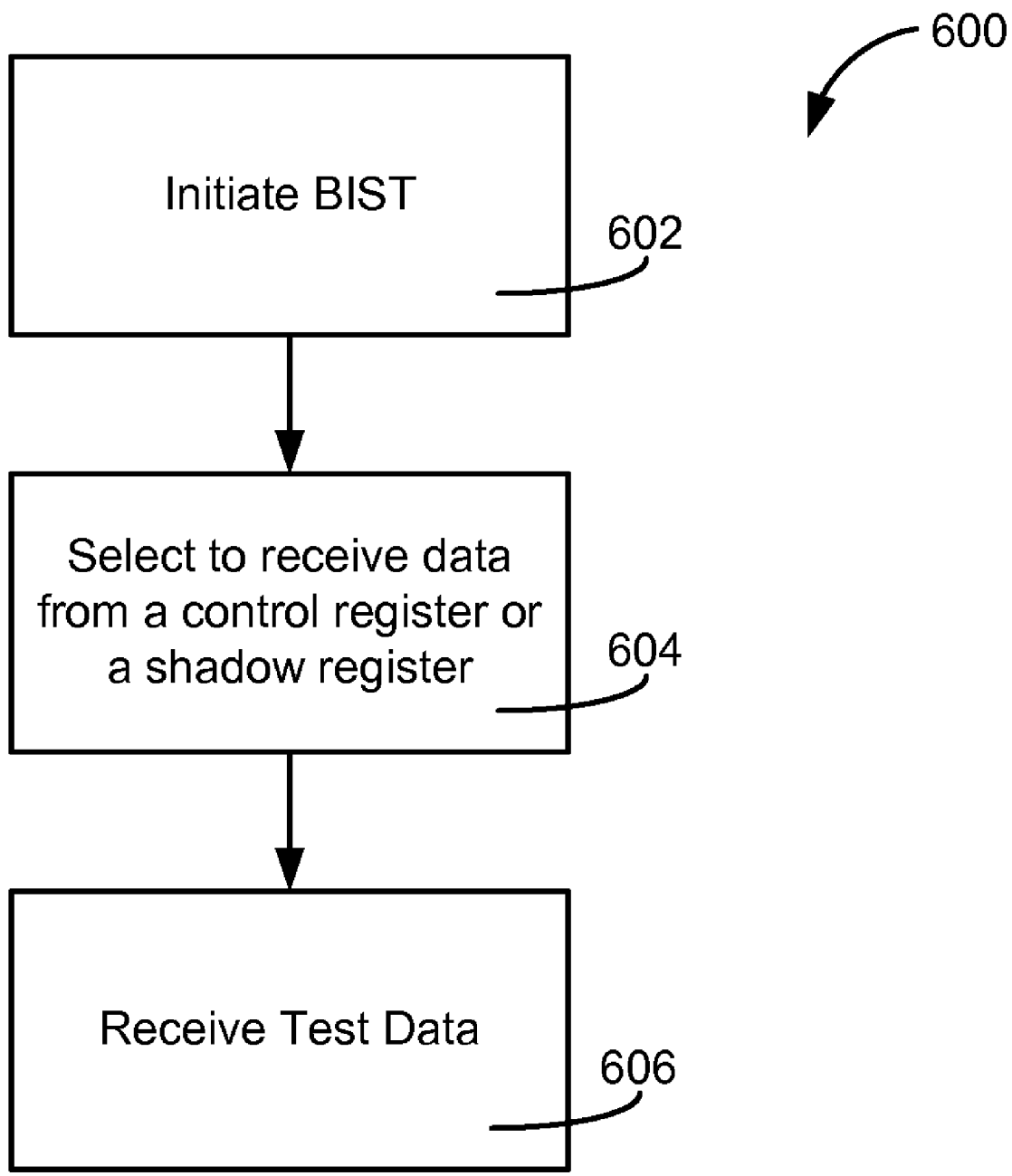
FIG. 6 is a flow diagram of a particular illustrative embodiment of a method of testing a memory.

FIG. 6 is a flow diagram of another particular illustrative embodiment of a method 600 of testing a memory, such as the memory 202. A BIST operation is initiated, at 602. In a particular embodiment, the BIST operation may be initiated by a controller, such as the controller 106. A selection is made to receive test data from either a first register or a second register, at 604. In a particular embodiment, the selection is made via a control line input to a multiplexer, such as the control line 234 and the multiplexer 206. Output data (e.g. test data from the BIST operation) is received from the selected register (e.g. either the first register 208 or the second register 210), at 606. In a particular embodiment, the output data is output data from a BIST read operation. In a particular embodiment, the second register is selected when executing a BIST write operation following a BIST read operation.

Figure 7:
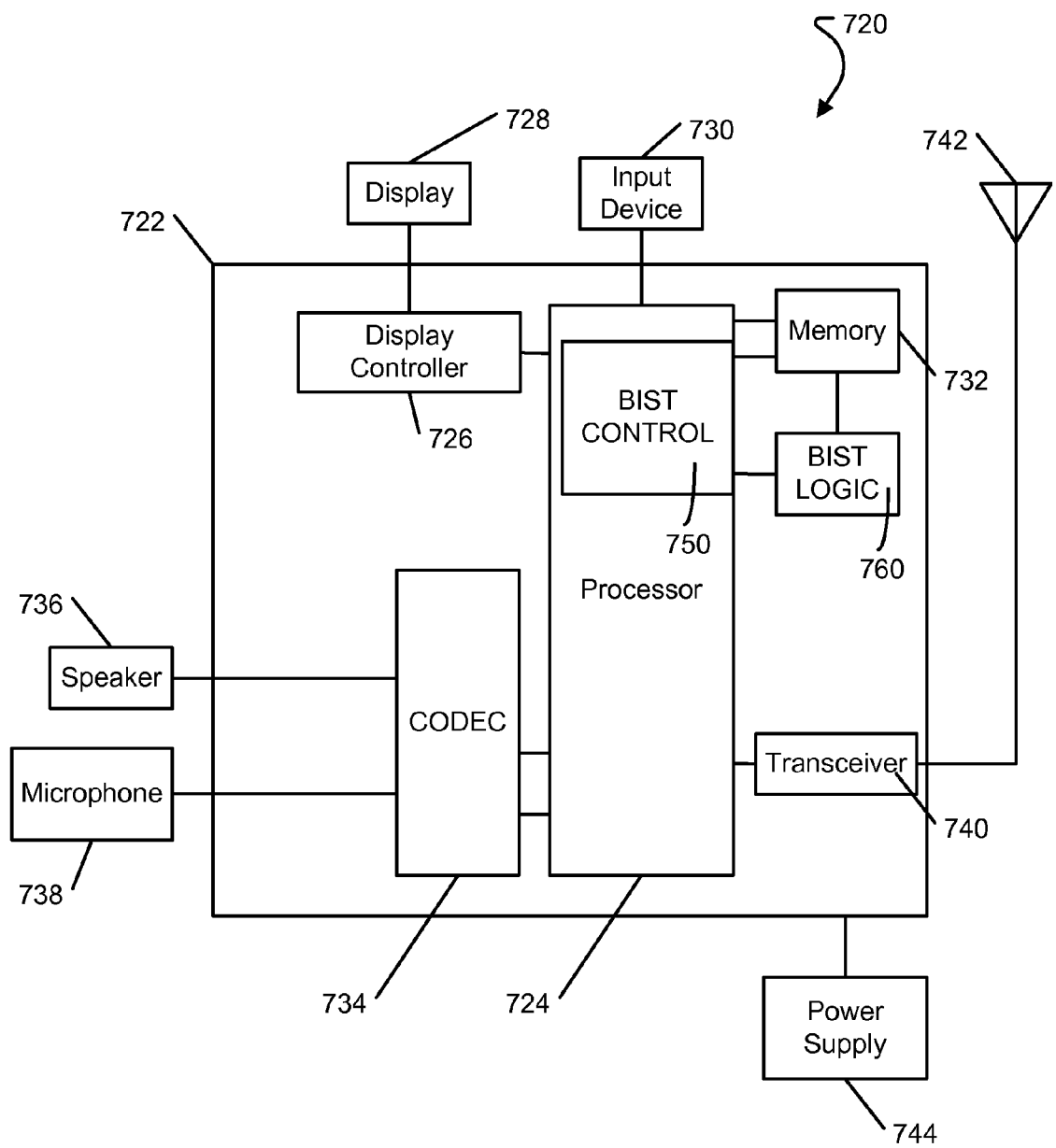
FIG. 7 is a general diagram of an exemplary portable communications device that may utilize a device for testing a memory and a method of testing a memory device, such as that described with respect to FIGS. 1-5.

FIG. 7 illustrates a particular exemplary, non-limiting embodiment of a portable communication device that is generally designated 720. As illustrated in FIG. 7, the portable communication device includes an on-chip system 722 that includes a processor 724. The processor 724 includes a BIST controller 750. In a particular embodiment, the processor 724 is the processor 102 shown in FIG. 1 and described herein. FIG. 7 also shows a display controller 726 that is coupled to the processor 724 and a display 728. Moreover, an input device 730 is coupled to the processor 724. As shown, a memory 732 is coupled to the processor 724. Alternatively, the memory 732 can be internal to the processor 724 or a controller. Also, the memory 732 is coupled to BIST logic 760. The BIST logic 760 is also coupled to the BIST controller 750. In a particular embodiment, the BIST logic 760 includes the first multiplexer 204 and the second multiplexer 206. In another particular embodiment, the BIST logic 760 includes the first multiplexer 204, the second multiplexer 206, the first register 208, and the second register 210. Additionally, a coder/decoder (CODEC) 734 can be coupled to the processor 724, a speaker 736, and a microphone 738.

FIG. 7 also indicates that a wireless transceiver 740 can be coupled to the processor 724 and to a wireless antenna 742. In a particular embodiment, a power supply 744 is coupled to the on-chip system 702. Moreover, in a particular embodiment, as illustrated in FIG. 7, the display 726, the input device 730, the speaker 736, the microphone 738, the wireless antenna 742, and the power supply 744 are external to the on-chip system 722. However, each is coupled to a component of the on-chip system 722.

In a particular embodiment, the processor 724 can send instructions, such as an instruction to conduct a built-in-self-test (BIST), to the BIST controller 750. The BIST controller 750 is programmed to execute an instruction to conduct a BIST. The BIST controller 750 is coupled to the BIST logic 760. The BIST logic 760 is operable to execute a BIST operation on the memory 732. In a particular embodiment, the logic 760 can send control signals to and receive data from the memory 732. In another embodiment, the BIST controller 750 can send control signals to and receive data from the memory 732. In a particular embodiment, the processor 724, the BIST controller 750, and the BIST logic 760 are incorporated into a single integrated circuit. In a particular embodiment, the BIST logic 760 allows for a dynamic selection of one of an output from a first register (not shown) and an output from a second register (not shown). During a BIST operation, the first register and the second register store output data of the BIST from the memory 732.

The devices and methods described herein are applicable to any device that has a memory and can perform a memory test operation. The devices and methods described herein are not limited to use in connection with the portable communication device 720 shown in FIG. 7. The portable communication device 720 is just one illustrative, non-limiting example of an application of the methods and devices described herein.

One particular advantage of the described devices and methods is that data collisions of a shared register used for memory testing can be avoided. Another particular advantage is that there is no loss of at-speed test coverage of the functional data paths during testing.

The various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. Such storage devices may be included within portable electronic devices, including but not limited to mobile telephones. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use such disclosed embodiments. Various modifications to these embodiments will be readily apparent to those skilled in the art, and the generic principles defined herein may be applied to other embodiments without departing from the spirit or scope of the disclosure. For example, the BIST controller and the BIST logic described herein could be incorporated in a computer, a data storage device, a personal digital assistant, a portable music player, or a cell phone. Thus, the present disclosure is not intended to be limited to the embodiments shown herein but is to be accorded the widest scope consistent with the principles and novel features as defined by the following claims.

What is claimed is:

1. A device comprising:
a computer readable memory having a first input and a first output;
a first register for storing data, the first register having a second input and a second output, the second output coupled to the first input of the computer readable memory;
a second register for storing data, the second register having a third input and a third output, the third input coupled to the first output of the computer readable memory;
logic responsive to the second output of the first register and the third output of the second register for dynamically switching between selection of the second output of the first register and the third output of the second register; and
a first multiplexer having a fourth output, the fourth output coupled to the second input of the first register, wherein a first input of the first multiplexer receives data during a write operation, a second input of the first multiplexer receives data during a test mode write operation, and a third input of the first multiplexer is coupled to the first output of the computer readable memory.

2. The device of claim 1, further comprising:
a control line coupled to the first multiplexer to control switching between selection of the first input of the first multiplexer, the second input of the first multiplexer, and the third input of the first multiplexer.

3. The device of claim 1, wherein the logic is operative during a read operation of a testing mode.

4. The device of claim 3, wherein the testing mode is a built-in-self-test (BIST).

5. The device of claim 1, wherein the logic is a second multiplexer.

6. The device of claim 5, further comprising:
a control line coupled to the second multiplexer to control switching of an output of the second multiplexer between the second output and the third output.

7. The device of claim 1, wherein the computer readable memory is a random access memory (RAM).

8. The device of claim 7, wherein the RAM has a write enable input, a read enable input, and an address input.

9. The device of claim 7, wherein the RAM has one access port and one output.

10. The device of claim 7, wherein the RAM has multiple access ports and multiple outputs.

11. A method for performing a test of a computer readable memory, the method comprising:
storing data retrieved from a computer readable memory to a first register and a second register wherein the computer readable memory has a first input and a first output, the first register has a second input and a second output, the second output coupled to the first input of the computer readable memory, and the second register has a third input and a third output, the third input coupled to the first output of the computer readable memory;
dynamically selecting output data from one of the first register and the second register;
receiving data during a write operation at a first input of a first multiplexer, the first multiplexer having a fourth output coupled to the second input of the first register; and
receiving data during a test mode write operation at a second input of the first multiplexer, wherein a third input of the first multiplexer is coupled to the first output of the computer readable memory.

12. The method of claim 11, further comprising:
selecting either the first register or the second register to provide the output data using the first multiplexer with a control line.

13. The method of claim 12, further comprising:
selecting the output data from the first register when executing a test operation that does not create a data collision from a previous operation.

14. The method of claim 12, further comprising:
selecting the output data from the second register when executing a test operation that utilizes the first register.

15. The method of claim 14, wherein the test operation is a test write operation.

16. The method of claim 12, further comprising:
selecting the output data from the second register when there is a test write operation preceded by a test read operation.

17. A method comprising:
initiating a test on a computer readable memory comprising a first input and a first output, the computer readable memory providing output data associated with the test;
selecting to receive the output data from one of a first register and a second register the first register comprising a second input and a second output, the second output coupled to the first input of the computer readable memory, and the second register comprising a third input and a third output, the third input coupled to the first output of the computer readable memory;
receiving data during a write operation at a first input of a first multiplexer, the first multiplexer comprising a fourth output coupled to the second input of the first register; and
receiving data during a test mode write operation at a second input of the first multiplexer, wherein a third input of the first multiplexer is coupled to the first output of the computer readable memory.

18. The method of claim 17, further comprising:
selecting to receive the output data from the first register or the second register using a control line coupled to selection logic.

19. The method of claim 18, wherein the selection logic comprises the first multiplexer.

20. The method of claim 17, wherein the test is a built-in-self-test (BIST).

21. The method of claim 17, further comprising selecting to receive the output data from the second register when a test for reading data is performed.

22. The method of claim 17, further comprising selecting to receive the output data from the second register when a test for writing data is initiated and a preceding test was for reading data.

23. A device comprising:
a computer readable memory;
a controller operable to initiate a test of the computer readable memory;
logic coupled to the controller, the logic operable to dynamically select a logic output to correspond to one of an output of a first register and an output of a second register;
wherein the first register and second register store data from the computer readable memory, the data resulting from the test;

a first multiplexer for receiving test write data and for receiving output data from the computer readable memory;

the first register comprising an input coupled to an output of the first multiplexer and comprising an output coupled to an input of the computer readable memory;

the second register comprising an input coupled to an output of the computer readable memory; and a second multiplexer comprising a first input coupled to the output of the first register and a second input coupled to an output of the second register, the second multiplexer further comprising a control line input for dynamic selection of the logic output based on the first input or the second input.

24. The device of claim 23, wherein the controller is further operable to select the logic output by use of a control line.

25. The device of claim 23, wherein the controller is further operably programmed to select the logic output to correspond to the second register when there is a test write operation immediately was preceded by a test read operation.

26. A wireless communication device, comprising:
an antenna;
a transceiver operably coupled to the antenna;
a processor coupled to the transceiver;
a memory unit coupled to the processor; and
a controller coupled to the processor and operable to initiate a test on the memory unit;
logic coupled to the controller and to the memory unit, the logic operable to allow dynamic selection of one of an output from a first register and an output from a second register;
a first multiplexer for receiving test write data and for receiving data from the memory unit;
the first register comprising an input coupled to an output of the first multiplexer and comprising an output coupled to an input of the memory unit;
the second register comprising an input coupled to an output of the memory unit; and a second multiplexer comprising a first input coupled to the output of the first register and a second input coupled to an output of the second register, the second multiplexer further comprising a control line input for dynamic selection of a logic output based on the first input or the second input.

27. The wireless communication device of claim 26, wherein the controller is further operable to select the output of the second register when there is a test write operation and an immediately preceding operation was a test read operation.

28. The wireless communication device of claim 26, wherein the test is a built-in-self-test (BIST).

29. The device comprising:
a computer readable memory having a first input and a first output;
a controller operable to initiate a test of the computer readable memory;
a first register for storing data, the first register comprising a second input and a second output, the second output coupled to the first input of the computer readable memory;
a second register for storing data, the second register comprising a third input and a third output, the third input coupled to the first output of the computer readable memory;
logic responsive to the second output of the first register and the third output of the second register for dynamically switching between selection of the second output of the first register and the third output of the second register;
a multiplexer coupled to the controller, the multiplexer comprising a fourth output, the fourth output coupled to the second input of the first register, wherein a first input of the multiplexer receives data during a write operation, a second input of the multiplexer receives data during a test mode write operation, and a third input of the multiplexer is coupled to the first output of the computer readable memory.

* * * * *

UNITED STATES PATENT AND TRADEMARK OFFICE
CERTIFICATE OF CORRECTION

PATENT NO. : 7,665,003 B2 Page 1 of 1
APPLICATION NO. : 11/611715
DATED : February 16, 2010
INVENTOR(S) : Shen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 488 days.

Signed and Sealed this

Twenty-eighth Day of December, 2010

David J. Kappos
*Director of the United States Patent and Trademark Office*